United States Patent
Minemura et al.

(10) Patent No.: US 8,675,388 B2
(45) Date of Patent: Mar. 18, 2014

(54) NONVOLATILE SEMICONDUCTOR MEMORY DEVICE

(75) Inventors: Yoichi Minemura, Yokkaichi (JP); Takayuki Tsukamoto, Yokkaichi (JP); Takafumi Shimotori, Kawasaki (JP); Hiroshi Kanno, Yokkaichi (JP); Natsuki Kikuchi, Mie (JP); Mitsuru Sato, Kuwana (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 365 days.

(21) Appl. No.: 13/233,679

(22) Filed: Sep. 15, 2011

(65) Prior Publication Data

US 2012/0069627 A1 Mar. 22, 2012

(30) Foreign Application Priority Data

Sep. 21, 2010 (JP) ................. 2010-210962

(51) Int. Cl.
*G11C 11/00* (2006.01)
(52) U.S. Cl.
USPC .......................................... 365/148
(58) Field of Classification Search
USPC ............ 365/46, 94, 100, 113, 129, 148, 163; 257/2–5, 296, E31.047, E27.006; 438/29, 95, 96, 166, 259, 365, 482, 438/486, 597; 977/754
See application file for complete search history.

(56) References Cited

U.S. PATENT DOCUMENTS

| 2007/0242528 A1* | 10/2007 | Inoue ....................... 365/189.01 |
| 2009/0296459 A1* | 12/2009 | Kim et al. ..................... 365/163 |
| 2010/0118590 A1 | 5/2010 | Carter et al. |
| 2010/0118593 A1* | 5/2010 | Cho et al. ........................ 365/148 |
| 2011/0026299 A1* | 2/2011 | Kanno et al. .................... 365/148 |
| 2011/0032745 A1 | 2/2011 | Ichihara et al. |
| 2011/0228586 A1* | 9/2011 | Kawabata et al. ............. 365/148 |
| 2011/0305070 A1* | 12/2011 | Ishihara ......................... 365/148 |

FOREIGN PATENT DOCUMENTS

| JP | 2007-129041 A | 5/2007 |
| JP | 2007-281208 | 10/2007 |
| JP | 2009-164480 | 7/2009 |
| JP | 2009-260060 | 11/2009 |
| JP | 2010-20863 | 1/2010 |
| JP | 2010-218681 A | 9/2010 |

OTHER PUBLICATIONS

Japanese Office Action issued Nov. 13, 2012 in Patent Application No. 2010-210962 with English Translation.

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

A nonvolatile semiconductor memory device includes: a memory cell array including plural first lines, plural second lines, and plural memory cells each including a variable resistance element; a first decoder connected to at least one ends of the plurality of first lines and configured to select at least one of the first lines; at least one pair of second decoders connected to both ends of the plurality of second lines and configured such that one of the pair of second decoders is selected for selecting the second lines according to a distance between the one of the first lines selected by the first decoder and the both ends of the second lines; and a voltage application circuit configured to apply a certain voltage between the first line and the second line selected by the first decoder and the second decoder.

20 Claims, 13 Drawing Sheets

VRow Driver 33

Main Row decoder 31

Column Switch 20

Column decoder 21

Sense Amp & Write Buffer 22

VCol Driver 23

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-210962, filed on Sep. 21, 2010, the entire contents of which are incorporated herein by reference.

FIELD

Embodiments described herein relate to a nonvolatile semiconductor memory device.

BACKGROUND

Description of the Related Art

In recent years, a resistance varying memory device which employs a variable resistance element as a storage element is attracting attention as a candidate to succeed flash memory. The resistance varying memory device herein includes not only resistance varying memory (ReRAM: Resistive RAM) in a narrow sense which uses a transition metal oxide as a recording layer to store a resistance state of the transition metal oxide in a nonvolatile manner, but also phase change memory (PCRAM: Phase Change RAM) which uses chalcogenide or the like as a recording layer to utilize resistance information of a crystalline state (conductor) and an amorphous state (insulator), and so on.

To realize a high-density memory cell array by a resistance varying memory device, a cell array is configured by stacking a variable resistance element and a rectifier element such as a diode at intersections of bit lines and word lines. Furthermore, arranging such memory cell arrays three-dimensionally in a stack allows a large capacity memory to be realized, without increasing cell array area.

Some variable resistance elements require to undergo forming as an initial setting operation in order to allow the variable resistance element to function as a memory cell of a variable resistance type memory. This forming is performed by applying a certain voltage higher than that for a write operation of data to the variable resistance element to form a current path in the variable resistance element, and thereby setting a certain resistance state, for example, a low-resistance state. The write operation of data to a memory cell that has undergone such forming is performed by applying a certain voltage to the variable resistance element. This causes the variable resistance element to change from a high-resistance state to a low-resistance state. Hereinafter, this operation to change the variable resistance element from the high-resistance state to the low-resistance state is called a setting operation. On the other hand, an erase operation of data in a memory cell is performed by applying a certain voltage to the variable resistance element in the low-resistance state subsequent to the setting operation, the certain voltage being different to that of the setting operation. This causes the variable resistance element to change from the low-resistance state to the high-resistance state. Hereinafter, this operation to change the variable resistance element from the low-resistance state to the high-resistance state is called a resetting operation. The memory cell adopts, for example, the high-resistance state as a stable state (reset state), and, in the case of binary data storage, the write operation of data is performed by the setting operation in which the reset state is changed to the low-resistance state. On the other hand, a read operation of the memory cell is performed by applying a certain voltage to the variable resistance element and monitoring a current flowing via the variable resistance element by means of a differential amplifier. This read operation allows it to be judged whether the variable resistance element is in the low-resistance state or the high-resistance state.

It is required in this kind of semiconductor memory device that the forming operation, setting operation or resetting operation causes the state of the variable resistance element to change with certainty.

DETAILED DESCRIPTION

A nonvolatile semiconductor memory device according to an embodiment comprises: a memory cell array including a plurality of first lines, a plurality of second lines configured to intersect the plurality of first lines, and a plurality of memory cells disposed at each of intersections of the plurality of first and second lines and each including a variable resistance element configured to store an electrically rewritable resistance value as data in a nonvolatile manner; a first decoder connected to at least one ends of the plurality of first lines and configured to select at least one of the first lines; at least one pair of second decoders connected to both ends of the plurality of second lines and configured such that one of the pair of second decoders is selected for selecting the second lines according to a distance between the one of the first lines selected by the first decoder and the both ends of the second lines; and a voltage application circuit configured to apply a certain voltage between the first line and the second line selected by the first decoder and the second decoder.

A nonvolatile semiconductor memory device according to an embodiment is described in detail below with reference to the drawings.

[First Embodiment]
[Overall Configuration]

Figure 1:
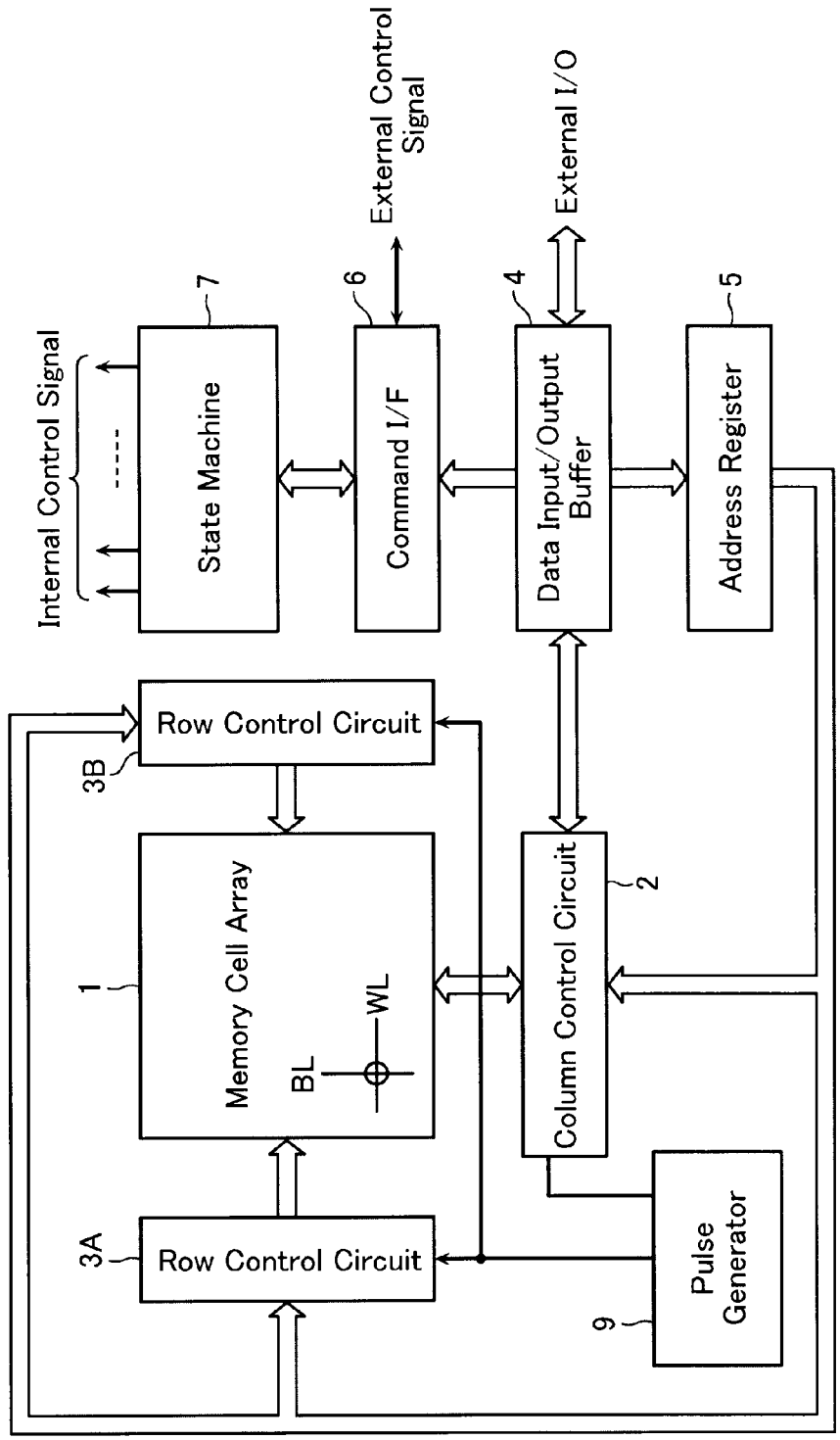
FIG. 1 is a block diagram of a nonvolatile semiconductor memory device according to a first embodiment.

FIG. 1 is a block diagram of a nonvolatile semiconductor memory device according to a first embodiment.

This nonvolatile semiconductor memory device comprises a memory cell array 1 in which memory cells are disposed in a matrix, each of the memory cells employing a resistance varying type element such as PCRAM (phase change type element) or ReRAM (variable resistance element) to be described later. Provided at a position adjacent to the memory cell array 1 in a bit line BL direction of the memory cell array 1 is a column control circuit 2 configured to control a bit line BL of the memory cell array 1 to perform data erase of the memory cells, data write to the memory cells, and data read from the memory cells. In addition, provided at positions adjacent to the memory cell array 1 on both sides in a word line WL direction of the memory cell array 1 are row control circuits 3A, 3B configured to select a word line WL of the memory cell array 1 and apply a voltage required in data erase of the memory cells, data write to the memory cells, and data read from the memory cells. These column control circuit 2 and row control circuits 3A, 3B configure a data read/write circuit for performing read/write of data from/to the memory cell array 1.

A data input/output buffer 4 is connected to an external host device not shown to receive write data, receive erase instructions, output read data, and receive address data and command data from/to the host device. The data input/output buffer 4 sends received write data to the column control circuit 2 and receives read data from the column control circuit 2 and outputs it to external. An address supplied from the external host device to the data input/output buffer 4 is sent via an address register 5 to the column control circuit 2 and the row control circuits 3A, 3B. Moreover, a command supplied from the external host device to the data input/output buffer 4 is sent to a command interface 6. The command interface 6 receives an external control signal from external and decides whether the data inputted to the data input/output buffer 4 is write data, a command or an address. If the data is a command, then the command interface 6 transfers it as a received command signal to a state machine 7. The state machine 7 manages this nonvolatile semiconductor memory device in its entirety to receive commands from the external host device, and perform read, write, erase, data input/output management, and so on. In addition, the external host device can also receive status information managed by the state machine 7 and decide an operation result. Moreover, this status information is also utilized in control of a write operation and an erase operation.

Further, the state machine 7 controls a pulse generator 9. Under this control, the pulse generator 9 is allowed to output a pulse of any voltage at any timing. The pulse formed herein can be transferred to any line selected by the column control circuit 2 and the row control circuits 3A, 3B.

Note that peripheral circuit elements other than the memory cell array 1 can be formed on a silicon Si substrate immediately beneath the memory cell array 1 formed in a wiring layer. Thus, a chip area of this nonvolatile semiconductor memory device can be made substantially equal to an area of the memory cell array 1.

[Memory Block]

Figure 2:
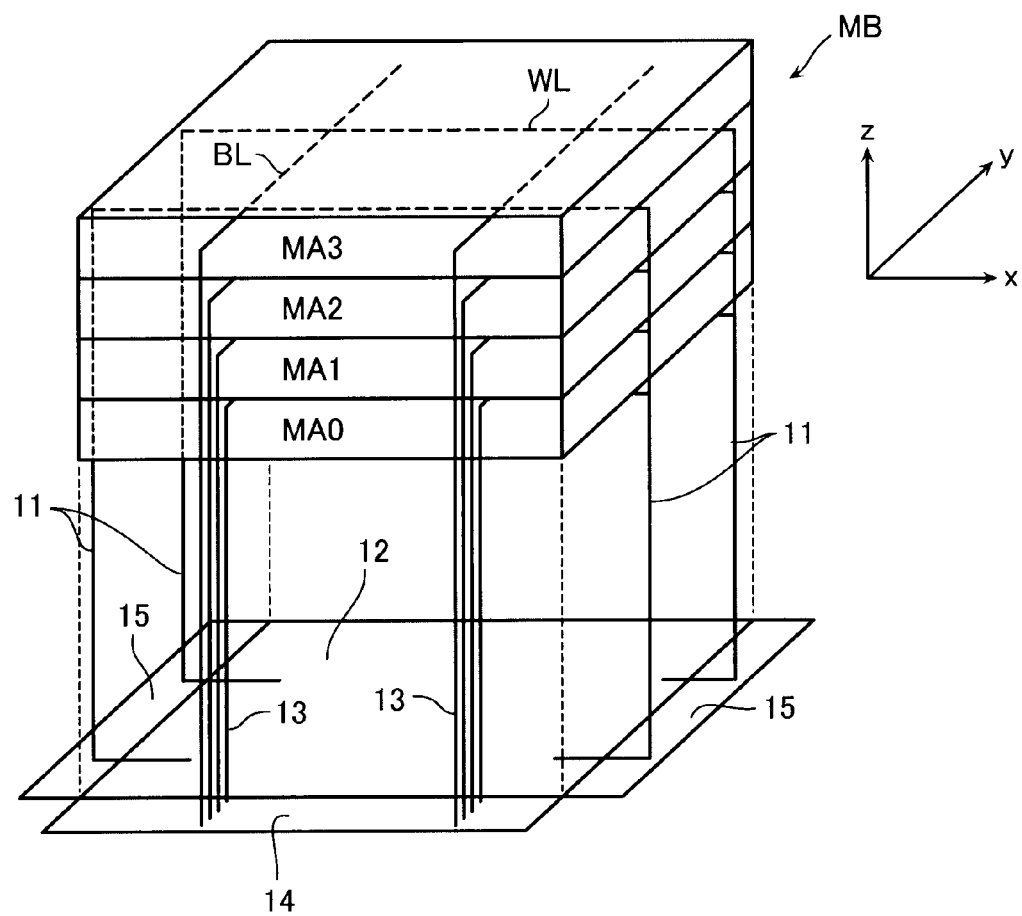
FIG. 2 is a perspective view showing a configuration of a memory cell array in the nonvolatile semiconductor memory device according to the same embodiment.

FIG. 2 shows a basic configuration of a resistance varying memory device according to the embodiment of the present invention, that is, the configuration of a wiring region 12 in which wirings of a global bus and so on are formed on a semiconductor substrate, and a memory block MB stacked on the wiring region 12.

As shown in FIG. 2, the memory block MB in this example is configured from four layers of memory cell arrays MA0-MA3. Provided on the semiconductor substrate immediately below the memory block MB is the wiring region 12. Provided in the wiring region 12 are a global bus and so on for performing exchange of data written/read to/from the memory block MB with external. In addition, this wiring region 12 may also be provided with the column control circuit 2 including column switches and so on, and/or the row control circuits 3A, 3B including row decoders and so on, to be described later.

Vertical wiring (via contacts) are required in a side wall of the memory block MB to connect the word lines WL and bit lines BL of each of the stacked memory cell arrays MA with the wiring region 12 formed on the semiconductor substrate. Formed in a periphery of the wiring region 12 are a bit line contact region 14 and a word line contact region 15. Formed in the bit line contact region 14 and the word line contact region 15 are bit line contacts 13 and word line contacts 11 for connecting the bit lines BL and word lines WL with a control circuit. The word line WL has its one end connected to the wiring region 12 via the word line contact 11 formed in the word line contact region 15. In addition, the bit line BL has its one end connected to the wiring region 12 via the bit line contact 13 formed in the bit line contact region 14.

FIG. 2 shows one memory block MB having a plurality of memory cell arrays MA stacked in a direction perpendicular to the semiconductor substrate (z direction shown in FIG. 2). However, in reality, a plurality of such unit memory blocks MB are disposed in a matrix in a longer direction of the word lines WL (x direction in FIG. 2) and a longer direction of the bit lines BL (y direction in FIG. 2).

As shown in FIG. 2, in the word line contact region 15 in the present embodiment, the word lines WL extending out from both sides of the memory cell array 1 are each connected to the wiring region 12 via a common contact. Moreover, in the bit line contact region 14 in the present embodiment, bit lines BL of each layer are connected to the wiring region 12 via four columns of contacts that are separately provided. In the present embodiment, the bit lines BL are independently driven on a layer by layer basis and the word lines WL are commonly connected in all layers. However, the word lines WL may also be configured to be independently driven on a layer by layer basis. Moreover, the bit lines BL may be configured to be commonly connected and the word lines WL configured to be independently driven. Furthermore, one or both of the bit lines BL and word lines WL may be configured to share a layer above and a layer below.

Figure 3:
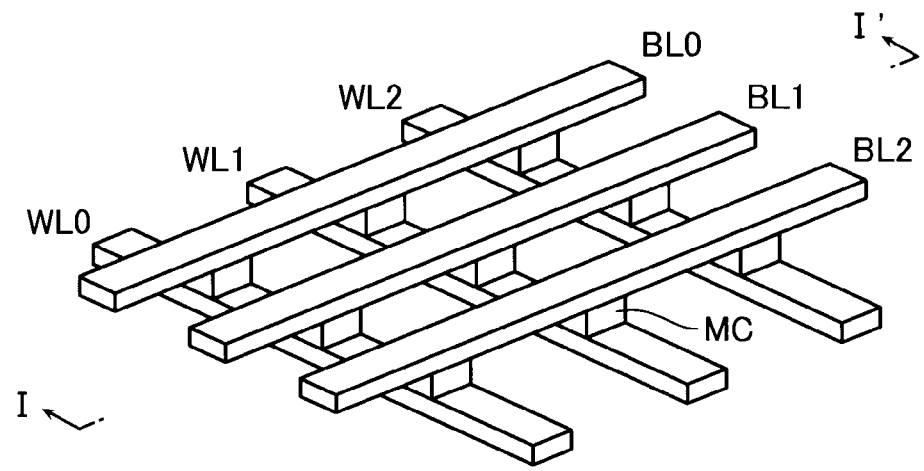
FIG. 3 is a perspective view of part of the memory cell array in the nonvolatile semiconductor memory device according to the same embodiment.
Figure 4:
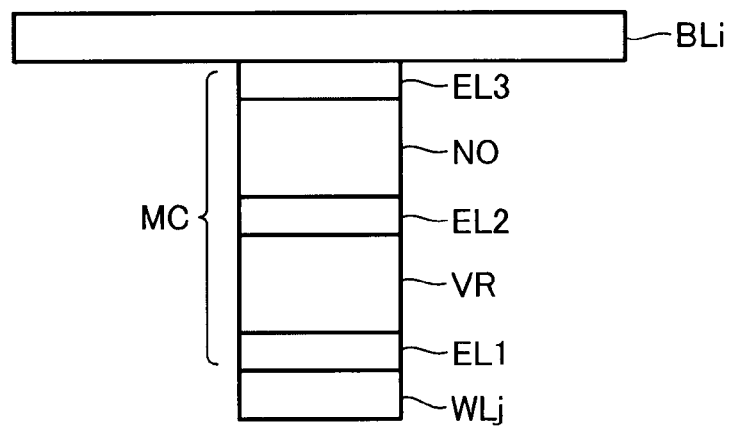
FIG. 4 is a cross-sectional view of a single memory cell portion taken along the line I-I' and viewed in the direction of the arrows in FIG. 3.

FIG. 3 is a perspective view of part of the memory cell array 1, and FIG. 4 is a cross-sectional view of a single memory cell MC portion taken along the line I-I' and viewed in the direction of the arrows in FIG. 3.

A plurality of bit lines BL0-BL2 acting as first lines are arranged in parallel, a plurality of word lines WL0-WL2 acting as second lines are arranged in parallel so as to intersect the plurality of bit lines BL0-BL2, and a memory cell MC is disposed sandwiched between both lines at each of intersections of these plurality of bit lines BL0-BL2 and plurality of word lines WL0-WL2. The first and second lines may be configured from a heat-resistive low-resistance material such as W, WSi, NiSi, or CoSi.

As shown in FIG. 4, the memory cell MC comprises a series-connected circuit of a variable resistance element VR and a non-ohmic element NO.

Used for the variable resistance element VR is a substance which can vary its resistance value through current, heat, or chemical energy on voltage application. Disposed above and below the variable resistance element VR are electrodes EL1, EL2 configured to function as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN, or the like. In addition, a metal film for uniformizing orientation may also be interposed. Moreover, a separate buffer layer, barrier metal layer, adhesive layer, and so on, may further be interposed.

Utilizable as the variable resistance element VR are, for example: ones like chalcogenide or the like in which the resistance value is varied due to phase transition between a crystalline state and an amorphous state (PCRAM); ones in which the resistance value is varied by precipitating metal cations to form a contacting bridge between the electrodes and ionizing the precipitated metal to destroy the contacting bridge (CBRAM); and ones in which the resistance value is varied by voltage or current application (broadly divided into ones in which a resistance variation occurs due to presence/absence of a charge trapped in a charge trap existing in an electrode interface and ones in which a resistance variation occurs due to presence/absence of a conductive path induced by oxygen deficiency or the like) (ReRAM).

Figure 5:
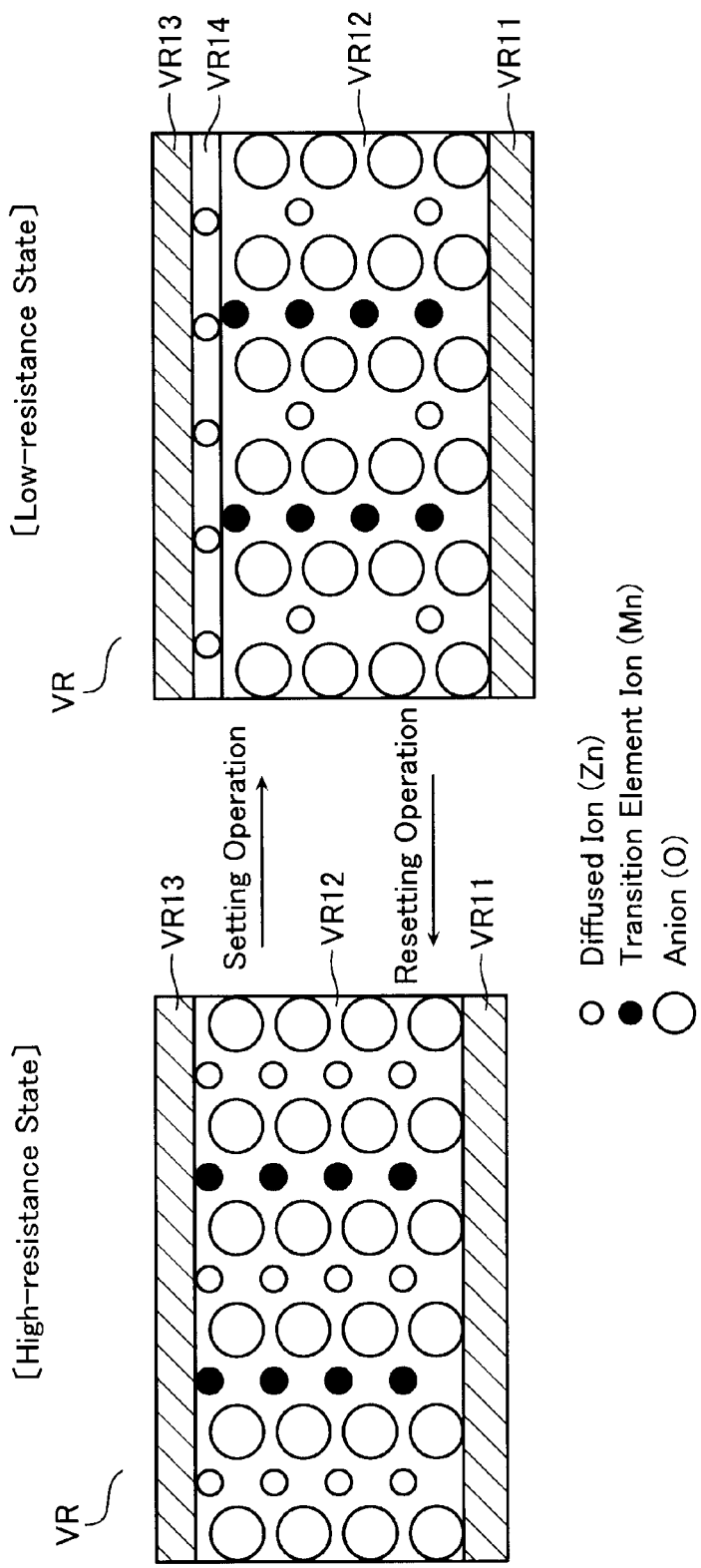
FIG. 5 is a schematic cross-sectional view showing an example of a variable resistance element in the nonvolatile semiconductor memory device according to the same embodiment.

FIG. 5 is a view showing an example of ReRAM. The variable resistance element VR shown in FIG. 5 is configured having a recording layer VR12 disposed between electrode layers VR11 and VR13. The recording layer VR12 is configured from a composite compound including at least two types of cation elements. At least one of the cation elements is a transition element having the d-orbit incompletely filled with electrons, and a shortest distance between adjacent cation elements is 0.32 nm or less. Specifically, it is represented by a chemical formula $A_xM_yX_z$ (A and M are different elements) and is configured by a material having a crystalline structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 5, A comprises Zn, M comprises Mn, and X comprises O. In the recording layer VR12 of FIG. 5, a small white circle represents a diffused ion (Zn), a large white circle represents an anion (O), and a small black circle represents a transition element ion (Mn).

An initial state of the recording layer VR12 is the high-resistance state. When the electrode layer VR11 is kept at a fixed potential and a negative voltage is applied to the electrode layer VR13, part of diffused ions in the recording layer VR12 migrate toward the electrode layer VR13 to reduce diffused ions in the recording layer VR12 relative to anions. The diffused ions arrived at the electrode layer VR13 accept electrons from the electrode layer VR13 and precipitate as a metal, thereby forming a metal layer VR14. Inside the recording layer VR12, anions become excessive and consequently increase the valence of the transition element ion in the recording layer VR12. As a result, injection of carriers causes the recording layer VR12 to become electron conducting, thereby completing a setting operation. On reading, a current maybe allowed to flow, a value of which is minute enough to prevent resistance variation occurring in the material configuring the recording layer VR12. The set state (low-resistance state) maybe reset to the initial state (high-resistance state) by, for example, supplying a large current flow in the recording layer VR12 for a sufficient time, which causes Joule heating to facilitate the oxidation reduction reaction in the recording layer VR12. Moreover, application of an electric field in the opposite direction from that at the time of setting may also allow a resetting operation to be performed.

[Configuration of Control Circuit]

Figure 6:
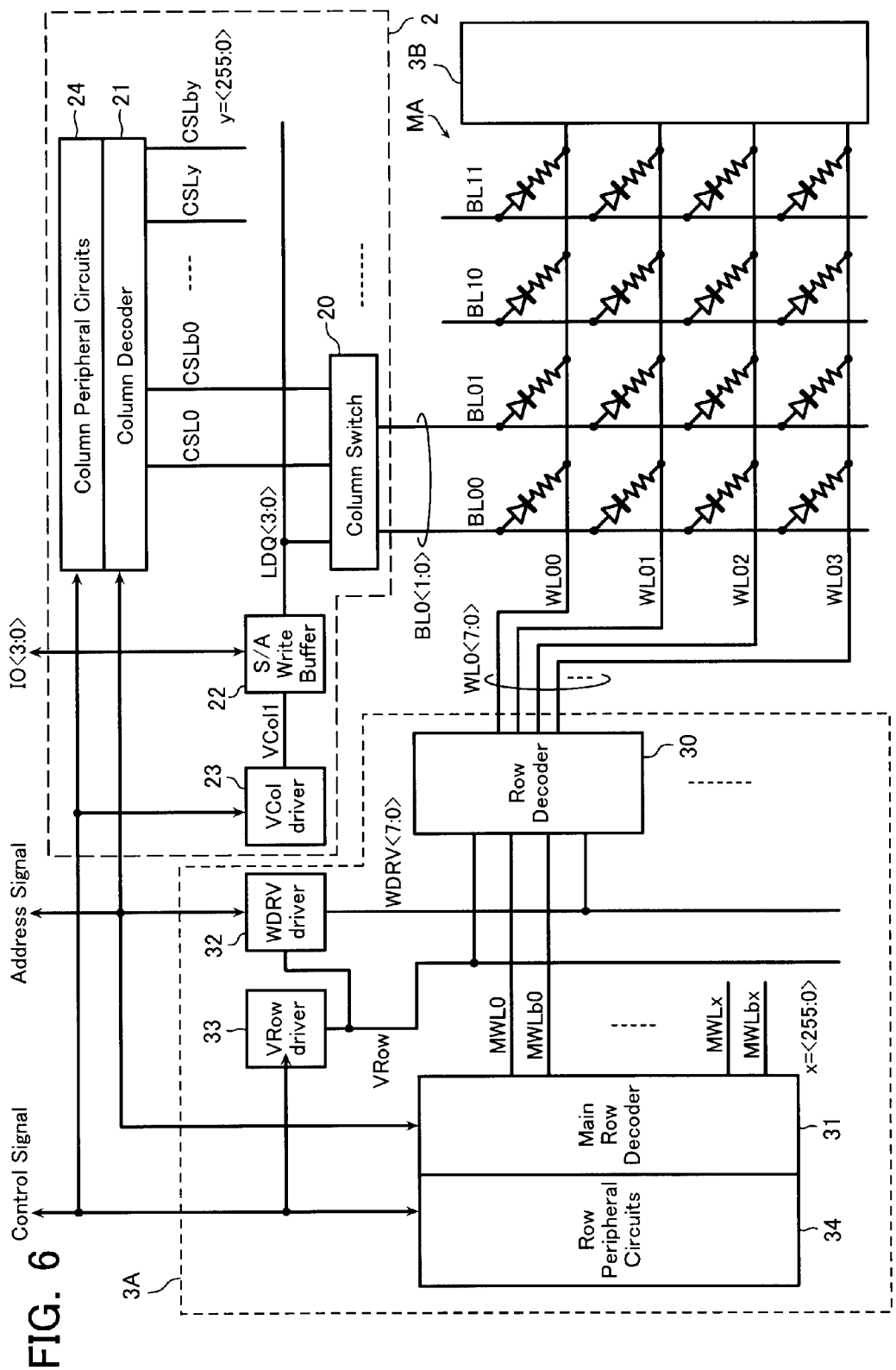
FIG. 6 is a block diagram showing an arrangement example of column/row control circuits in the nonvolatile semiconductor memory device according to the same embodiment.

Next, a configuration of the memory cell array MA and its peripheral circuits are described with reference to FIG. 6. FIG. 6 is a block diagram showing details of the memory cell array MA, column control circuit 2, and row control circuit 3A in the resistance varying memory device. The memory cell array MA shown in FIG. 6 has, for example, 2K bit (2048) unit memory cells MC disposed in a direction of extension of the bit lines BL and 512 bits unit memory cells MC disposed in a direction of extension of the word lines WL. As a result, there are, for example, 1M bit (approximately $10^6$) unit memory cells MC disposed in one memory cell array MA.

As shown in FIG. 6, the row control circuits 3A, 3B are disposed on both sides in the word line WL direction of the memory cell array 1. The row control circuits 3A, 3B have a substantially identical configuration, hence only the configuration of the row control circuit 3A is described in detail below. The row control circuit 3A is configured comprising, for example, a row decoder 30, a main row decoder 31, a write drive line driver 32, a row power supply line driver 33, and a row peripheral circuit 34. Moreover, the column control circuit 2 is configured comprising, for example, a column switch 20, a column decoder 21, a sense amplifier/write buffer 22, a column power supply line driver 23, and a column peripheral circuit 24.

The word lines WL according to the present embodiment are selected hierarchically. For example, the main row decoder 31 selectively drives any one pair of main word lines MWLx, MWLbx from among 256 pairs of main word lines MWLx, MWLbx (x=<255:0>). As an example, in a selected main word line MWLx, MWLbx, the main word line MWLx is in "H" state, and the main word line MWLbx is in "L" state. Conversely, in an unselected main word line MWLx, MWLbx, the main word line MWLx is in "L" state, and the main word line MWLbx is in "H" state. One pair of main word lines MWLx, MWLbx is connected to one row decoder 30. The row decoder 30 selectively drives one word line WL of a word line group WLx<7:0> configured from eight word lines WL, these word lines WL being in a hierarchical layer below the main word lines MWLx, MWLbx. As a result of the main row decoder 31 selectively driving a main word line MWLx, MWLbx and as a result of the row decoder 30 to which the selected main word line MWLx, MWLbx is connected further selectively driving a word line WL, one word line WL is selectively driven.

Connected to the write drive line driver 32 are eight write drive lines WDRV<7:0> and a row power supply line VRow, and connected to the row power supply line driver 33 is the row power supply line VRow. These write drive lines WDRV<7:0> and row power supply line VRow are connected to the row decoder 30. The write drive lines WDRV<7:0> and row power supply line VRow are applied with a voltage for the row decoder 30 to drive the word line WL. Specifically, during a resetting operation, the one of the eight write drive lines WDRV<7:0> corresponding to the selected word line WL is supplied with a voltage Vss (=0 V), and the other seven write drive lines WDRV are supplied with a voltage VRESET. In addition, the row power supply line VRow is applied with a voltage (VRESET) to be supplied to word lines WL in a hierarchical layer below unselected main word lines MWLx, MWLbx.

The row peripheral circuit 34 manages this resistance varying memory device in its entirety to receive control signals from the external host device, and perform read, write, erase, data input/output management, and so on.

The bit lines BL according to the present embodiment are selected hierarchically. The column decoder 21 selectively drives a plurality of pairs of column select lines CSLy, CSLby from among 256 pairs of column select lines CSLy, CSLby (y=<255:0>). As an example, in a selected column select line CSLy, CSLby, the column select line CSLy is in "H" state, and the column select line CSLby is in "L" state. Conversely, in an unselected column select line CSLy, CSLby, the column select line CSLy is in "L" state, and the column select line CSLby is in "H" state. One pair of column select lines CSLy, CSLby is connected to one column switch 20. The column switch 20 selectively drives a bit line group BLy<1:0> configured from two bit lines BL, these bit lines BL being in a hierarchical layer below the column select lines CSLy, CSLby. As a result of the column decoder 21 selectively driving a column select line CSLy, CSLby and as a result of the column switch 20 to which the selected column select line CSLy, CSLby is connected further selectively driving a bit line BL, the bit lines BL are selectively driven.

Connected to the sense amplifier/write buffer 22 are four local data lines LDQ<3:0>. These local data lines LDQ<3:0> are divided into groups of two lines each, namely groups LDQ<1:0> or LDQ<3:2>, and are connected to the column switch 20. One column switch has either one of the groups LDQ<1:0> or LDQ<3:2> connected thereto. The sense amplifier/write buffer 22 detects and amplifies a signal read out to the local data lines LDQ<3:0>, and also supplies write data inputted from data input/output lines IO<3:0>, via the column switch 20, to the memory cell MC. The local data lines LDQ<3:0> are applied with a voltage for the column switch 20 to drive the bit line BL. Specifically, during the resetting operation, the four local data lines LDQ<3:0> are supplied with the voltage VRESET. The column power supply line driver 23 is connected to the sense amplifier/write buffer 22 via a column power supply line VCol1.

The column peripheral circuit 24 manages this resistance varying memory device in its entirety to receive control signals from the external host device, and perform read, write, erase, data input/output management, and so on.

Next, a configuration of the row control circuit is described in detail with reference to FIGS. 7-11. FIGS. 7-11 are circuit diagrams showing the row control circuit in the resistance varying memory device.

[Configuration of Row Decoder 30]

Figure 7:
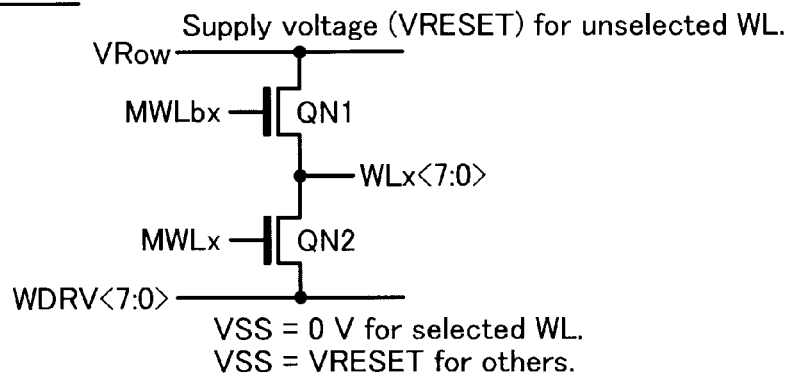
FIG. 7 is a circuit diagram showing a configuration example of part of the row control circuit in the nonvolatile semiconductor memory device according to the same embodiment.

As shown in FIGS. 6 and 7, connected to the row decoder 30 are any one pair from among 256 pairs of main word lines MWLx and MWLbx (x=<255:0>), the row power supply line VRow, and the write drive lines WDRV<7:0>. In addition, the row decoder 30 has the word line group WLx<7:0> connected thereto, and this word line group WLx<7:0> is connected to a plurality of memory cells MC provided arranged in a line. As previously mentioned, the word line group WLx<7:0> connected to one row decoder 30 is configured from the eight word lines WLx0-WLx7. Similarly, the write drive lines WDRV<7:0> are configured from the eight lines WDRV0-WDRV7.

As shown in FIG. 7, the row decoder 30 is configured comprising eight pairs of transistors each configured by two NMOS transistors QN1 and QN2 having sources connected to each other. The main word line MWLbx is connected to the gate of the transistor QN1, and the row power supply line VRow is connected to the drain of the transistor QN1. Moreover, the main word line MWLx is connected to the gate of the transistor QN2, and any one of the write drive lines WDRV<7:0> is connected to the drain of the transistor QN2. Further, the sources of the transistors QN1 and QN2 are both connected to any one word line of the word line group WLx<7:0>.

[Configuration of Main Row Decoder 31]

Figure 8:
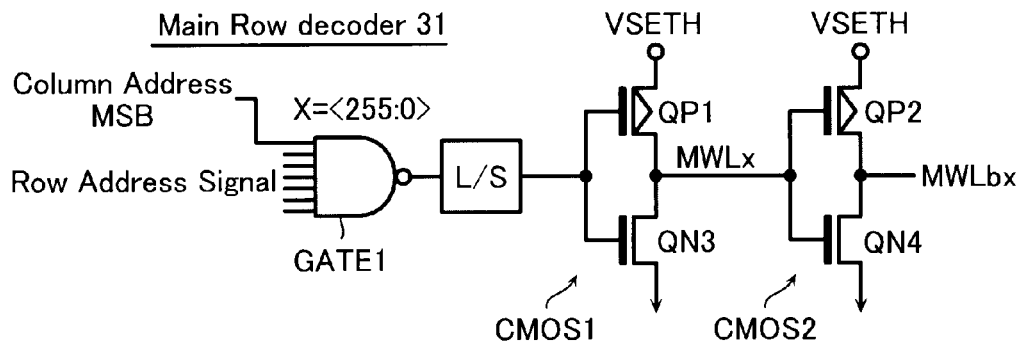
FIG. 8 is a circuit diagram showing a configuration example of part of the row control circuit in the nonvolatile semiconductor memory device according to the same embodiment.

As shown in FIGS. 6 and 8, connected to the main row decoder 31 are the 256 pairs of main word lines MWLx and MWLbx (x=<255:0>), and an address signal line. The word lines WL of the resistance varying memory device according to the present embodiment are selected hierarchically. The main row decoder 31 is a predecoder. One pair of main word lines MWLx, MWLbx is respectively connected to the eight pairs of transistors (QN1, QN2 in FIG. 7) in one row decoder 30, and the one row decoder 30 can select any one of the eight word lines WLx<7:0>. The main row decoder 31 includes a circuit of the kind shown in FIG. 8 for each pair of main word lines MWLx, MWLbx.

As shown in FIG. 8, in one main row decoder 31, address signal lines are connected to a logic gate GATE1. In addition, the logic gate GATE1 is inputted with a most significant bit MSB of a column address, a judgment is made of which side of bit line BL in the word line WL direction is to be selected, based on the MSB of the column address, and the main row decoder 31 is set to an active state or an inactive state. An output signal of the logic gate GATE1 is supplied via a level shifter L/S to an input terminal of a CMOS inverter CMOS1 configured from a PMOS transistor QP1 and an NMOS transistor QN3. A power supply VSETH is connected to the source of the transistor QP1, and the source of the transistor QN3 is grounded. Further, the drains of the transistors QP1 and QN3 are both connected to the main word line MWLx.

In addition, the main word line MWLx is connected to a CMOS inverter CMOS2 configured from a PMOS transistor QP2 and an NMOS transistor QN4. The power supply VSETH is connected also to the source of the transistor QP2, and the source of the transistor QN4 is grounded. Further, the drains of the transistors QP2 and QN4 are both connected to the main word line MWLbx.

Figure 11:
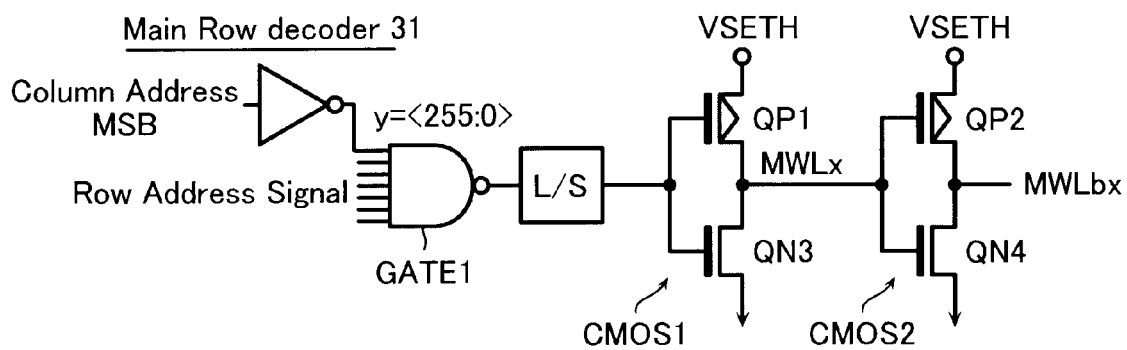
FIG. 11 is a circuit diagram showing a configuration example of another part of the row control circuit in the nonvolatile semiconductor memory device according to the same embodiment.

FIG. 11 shows a configuration of a main row decoder 31 disposed in the other row control circuit 3B. This main row decoder 31 in FIG. 11 has a basic configuration which is the same as that shown in FIG. 8, but differs in that the most significant bit MSB of the column address signal is inverted by an inverter to be inputted to a logic gate GATE1. As a result, when the most significant bit MSB of the column address signal is "1", the main row decoder in the row control circuit 3A (during forming and during setting) or the row control circuit 3B (during resetting) become active, and when the most significant bit MSB of the column address signal is "0", the main row decoder in the row control circuit 3B (during forming and during setting) or the row control circuit 3A (during resetting) become active.

[Configuration of Write Drive Line Driver 32]

Figure 9:
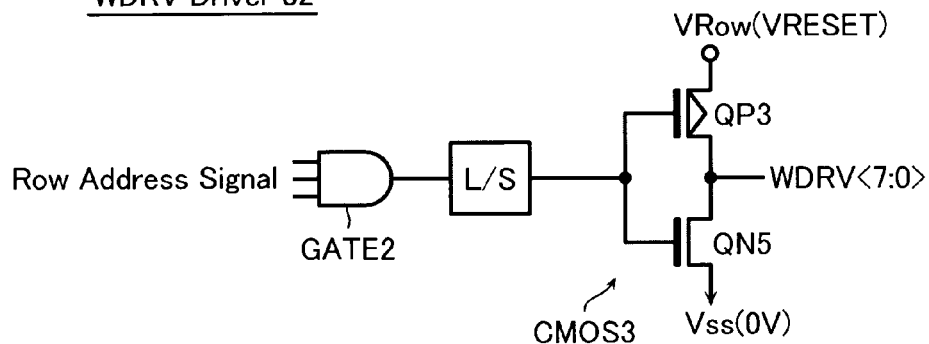
FIG. 9 is a circuit diagram showing a configuration example of part of the row control circuit in the nonvolatile semiconductor memory device according to the same embodiment.

As shown in FIGS. 6 and 9, connected to the write drive line driver 32 are the row power supply line VRow and the address signal lines. The write drive line driver 32 herein is also a predecoder.

The address signal lines connected to the write drive line driver 32 are connected to a logic gate GATE2. An output signal of the logic gate GATE2 is supplied via a level shifter L/S to an input terminal of a CMOS inverter CMOS3 configured from a PMOS transistor QP3 and an NMOS transistor QN5. Connected to the source of the transistor QP3 is the row power supply line VRow to which the voltage VRESET is applied as mentioned later. The source of the transistor QN5 is grounded. Further, the drains of the transistors QP3 and QN5 are both connected to the write drive lines WDRV<7:0>.

[Configuration of Row Power Supply Line Driver 33]

Figure 10:
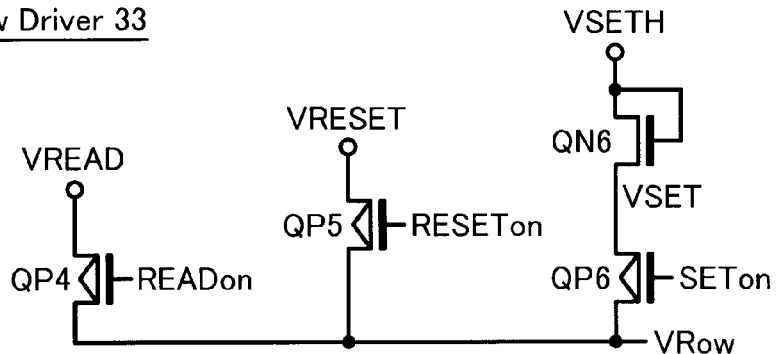
FIG. 10 is a circuit diagram showing a configuration example of part of the row control circuit in the nonvolatile semiconductor memory device according to the same embodiment.

As shown in FIGS. 6 and 10, connected to the row power supply line driver 33 are the row power supply line VRow and the control signal lines. In the row power supply line driver 33, the power supply VSETH is connected to the drain and the gate of an NMOS transistor QN6. The source of the transistor QN6 is connected to the row power supply line VRow via a PMOS transistor QP6. A control signal SETon is supplied to the gate of the transistor QP6.

In addition, in the row power supply line driver 33, a power supply VREAD is connected to the row power supply line VRow via a PMOS transistor QP4, and a power supply VRESET is connected to the row power supply line VRow via a PMOS transistor QP5. A control signal READon is supplied to the gate of the transistor QP4, and a control signal RESETon is supplied to the gate of the transistor QP5. The control signals READon, RESETon switch from "H" state to "L" state during, respectively, data read and the resetting operation.

Next, a configuration of the column control circuit 2 is described in detail with reference to FIGS. 12-15. FIGS. 12-15 are circuit diagrams showing the column control circuit 2 in the resistance varying memory device.

[Configuration of Column Switch 20]

Figure 12:
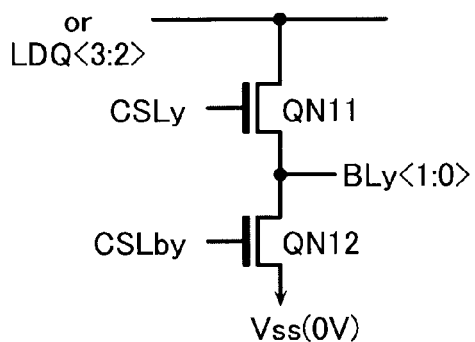
FIG. 12 is a circuit diagram showing a configuration example of part of the column control circuit in the nonvolatile semiconductor memory device according to the same embodiment.

As shown in FIGS. 6 and 12, connected to the column switch 20 are any one pair from among 256 pairs of column select lines CSLy and CSLby (y=<255:0>), and any one group of the local data lines LDQ<1:0> or LDQ<3:2>. The local data line LDQ<1:0> is connected to the column switch 20 to which one of the two pairs of column select lines CSLy, CSLby selected by the column decoder 21 according to the same column address signal CA is connected, and, moreover, the local data line LDQ<3:2> is connected to the column switch 20 to which the other of the two pairs of column select lines CSLy, CSLby selected by the column decoder 21 according to the same column address signal CA is connected. In addition, the column switch 20 has a bit line group BLy<1:0> connected thereto, and a bit line BL of this bit line group BLy<1:0> is connected to a plurality of memory cells MC provided arranged in a line. As previously mentioned, the bit line group BLy<1:0> connected to one column switch 20 is configured from two lines. Similarly, the local data lines LDQ<1:0> or LDQ<3:2> are configured from groups of two lines each, LDQ0, LDQ1 or LDQ2, LDQ3.

As shown in FIG. 12, the column switch 20 is configured comprising pairs of two transistors each configured by two NMOS transistors QN11 and QN12 having sources connected to each other. The column select line CSLy is connected to the gate of the transistor QN11, and one of the local data lines LDQ<1:0> or LDQ<3:2> is connected to the drain of the transistor QN11. Moreover, the column select line CSLby is connected to the gate of the transistor QN12, and the drain of the transistor QN12 is grounded. Further, the sources of the transistors QN11 and QN12 are both connected to any one bit line of the bit line group BLy<1:0>.

[Configuration of Column Decoder 21]

Figure 13:
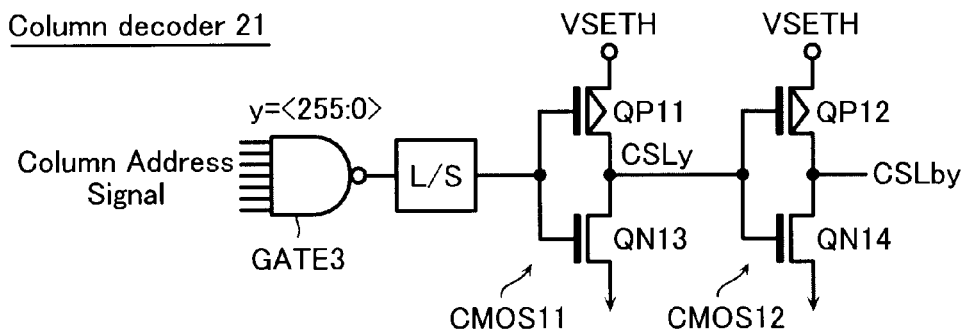
FIG. 13 is a circuit diagram showing a configuration example of part of the column control circuit in the nonvolatile semiconductor memory device according to the same embodiment.

As shown in FIGS. 6 and 13, connected to the column decoder 21 are the 256 pairs of column select lines CSLy and CSLby (y=<255:0>), and an address signal line inputted with the column address signal CA. In the resistance varying memory device according to the present embodiment, one pair of column select lines CSLy, CSLby is respectively connected to the two pairs of transistors (QN11, QN12 in FIG. 12) in one column switch 20, and the one column switch 20 can selectively drive the two bit lines of the bit line group BLy<1:0>. The column decoder 21 includes a circuit of the kind shown in FIG. 13 for each pair of column select lines CSLy, CSLby.

As shown in FIG. 13, in one column decoder 21, address signal lines are connected to a logic gate GATE3. An output signal of the logic gate GATE3 is supplied via a level shifter L/S to an input terminal of a CMOS inverter CMOS11 configured from a PMOS transistor QP11 and an NMOS transistor QN13. The power supply VSETH is connected to the source of the transistor QP11, and the source of the transistor QN13 is grounded. Further, the drains of the transistors QP11 and QN13 are both connected to the column select line CSLy.

In addition, the column select line CSLy is connected to a CMOS inverter CMOS12 configured from a PMOS transistor QP12 and an NMOS transistor QN14. The power supply VSETH is connected also to the source of the transistor QP12, and the source of the transistor QN14 is grounded. Further, the drains of the transistors QP12 and QN14 are both connected to the column select line CSLby.

[Configuration of Sense Amplifier/Write Buffer 22]

Figure 14:
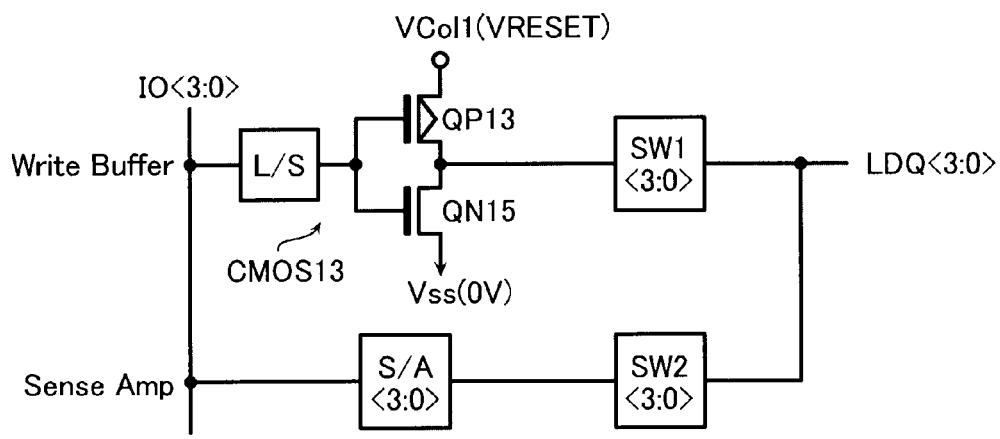
FIG. 14 is a circuit diagram showing a configuration example of part of the column control circuit in the nonvolatile semiconductor memory device according to the same embodiment.

As shown in FIGS. 6 and 14, connected to the sense amplifier/write buffer 22 are the column power supply line VCol1, the local data lines LDQ<3:0>, and the data input/output lines IO<3:0>. First, a configuration of a write buffer portion is described. The data input/output line IO<3:0> connected to the sense amplifier/write buffer 22 is connected via a level shifter L/S to a CMOS inverter CMOS13 configured from a PMOS transistor QP13 and an NMOS transistor QN15. The column power supply line VCol1 is connected to the source of the transistor QP13. As mentioned later, the column power supply line VCol1 is applied with the resetting voltage VRESET. In addition, the source of the transistor QN15 is grounded. Further, the drains of the transistors QP13 and QN15 are both connected to the local data line LDQ<3:0> via a switch SW1.

Next, a configuration of a sense amplifier portion is described. The data input/output line IO<3:0> connected to the sense amplifier/write buffer 22 is connected to a sense amplifier S/A. Various types of sense amplifiers S/A can be employed, for example, a single-end type, or a differential type using a reference cell. An output terminal of the sense amplifier S/A is connected to the local data line LDQ<3:0> via a switch SW2.

[Configuration of Column Power Supply Line Driver 23]

Figure 15:
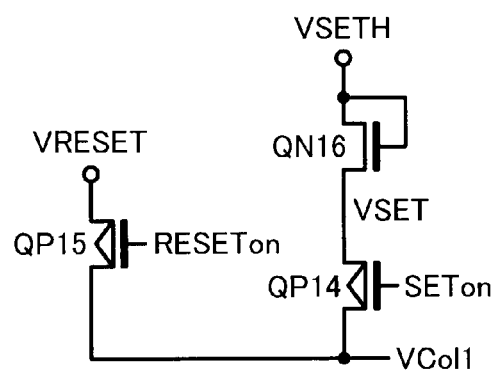
FIG. 15 is a circuit diagram showing a configuration example of part of the column control circuit in the nonvolatile semiconductor memory device according to the same embodiment.

As shown in FIGS. 6 and 15, connected to the column power supply line driver 23 are the column power supply line VCol1 and the control signal lines. In the column power supply line driver 23, the power supply VSETH is connected to the drain and the gate of an NMOS transistor QN16, and the source of the transistor QN16 is connected to the column power supply line VCol1 via a PMOS transistor QP14. The control signal SETon is supplied to the gate of the transistor QP14.

In addition, in the column power supply line driver 23, the power supply VRESET is connected to the column power supply line VCol1 via a PMOS transistor QP15. The control signal RESETon is supplied to the gate of the transistor QP15. The control signal RESETon switches from "H" state to "L" state during the resetting operation.

[Yield of Memory Cells in Forming and Resetting Operation]

Figure 16:
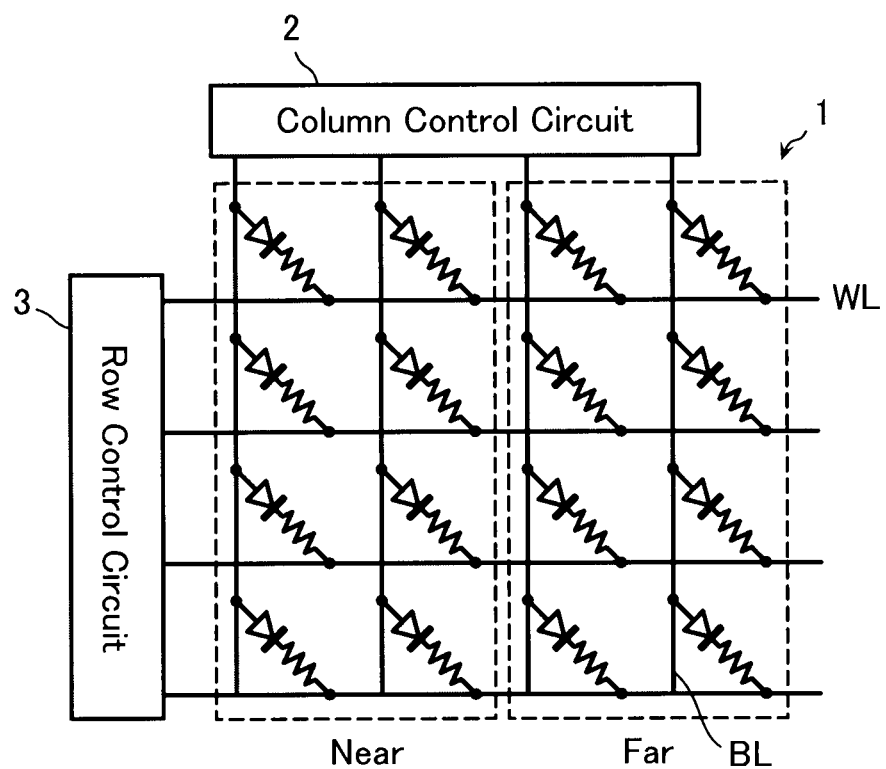
FIG. 16 is a circuit diagram of part of a memory cell array in a nonvolatile semiconductor memory device according to a comparative example.
Figure 17:
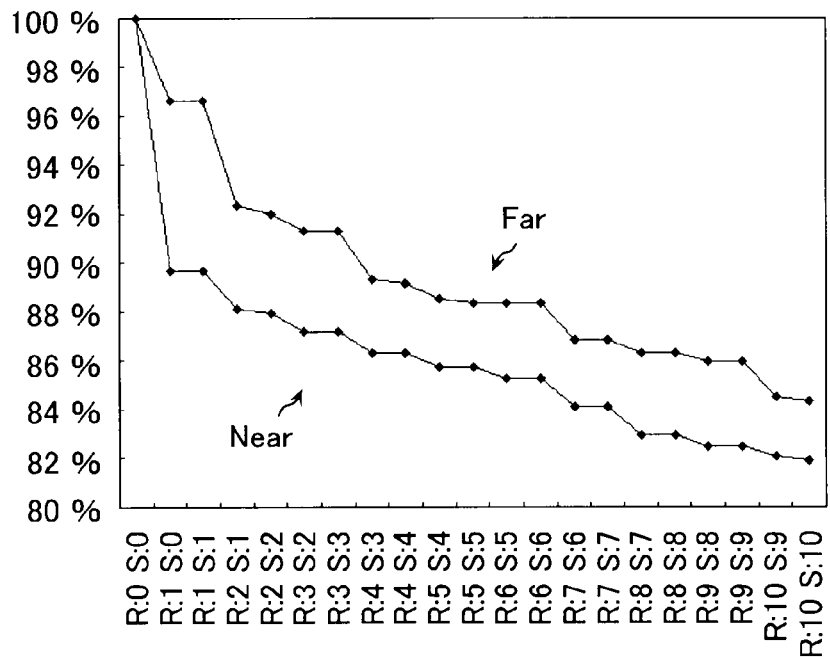
FIG. 17 is a view showing yield subsequent to a forming operation and a resetting operation of the memory cell array.
Figure 18:
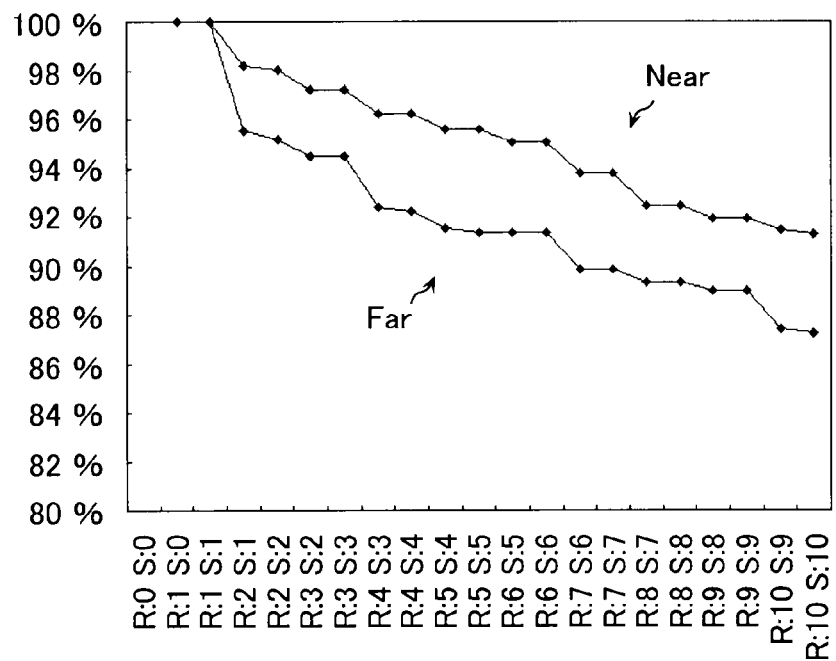
FIG. 18 is a view showing yield subsequent to the resetting operation of the memory cell array.

Next, yield of memory cells in forming and the resetting operation is described with reference to FIGS. 16-18. FIG. 16 is a circuit diagram of part of a memory cell array 1 in a nonvolatile semiconductor memory device according to a comparative example. In the present embodiment, two row control circuits 3 are disposed sandwiching the memory cell array 1. However, in the comparative example shown in FIG. 16, there is only one row control circuit 3 disposed. FIGS. 17 and 18 show results of testing correlation between number of possible write times of the memory cell array 1 and positional relationship of memory cells MC in the memory cell array 1. Testing was performed as follows. First, in a circuit as in FIG. 16, forming was performed on the memory cell array 1. Next, the resetting operation and the setting operation were repeatedly performed, alternately, ten times each. At this time, the half of the memory cells MC near to the row control circuit 3 was defined as Near group, the half of the memory cells MC far from the row control circuit 3 was defined as Far group, and the proportion of the number of memory cells shifted normally to forming, reset or set states at each time point in the testing process was compared.

The vertical axis in FIG. 17 shows the percentage of memory cells MC that have operated normally, and the horizontal axis in FIG. 17 shows the degree of progress of the testing work. Note that "R:n" in the horizontal axis of FIG. 17 shows the test result immediately after the n-th time of performing the resetting operation, and "S:n" in the horizontal axis of FIG. 17 shows the test result immediately after the n-th time of performing the setting operation. For example, the portion notated "R:4 S:3" shows the test result at the time point when the fourth time of the resetting operation and the third time of the setting operation have been completed. It is clear from FIG. 17 that in the first resetting operation immediately after forming, about 10% of the memory cells MC in the Near group have failed. In contrast, it is clear that only about 3-4% of the memory cells MC in the Far group have failed. This is considered to be because a wiring distance from the row control circuit 3 to the memory cells MC in the Far group is comparatively long, hence the wiring resistance works as a protective element.

FIG. 18 shows the same test results as FIG. 17. However, in FIG. 18, the results are shown only for memory cells MC that passed in the first time resetting operation. Specifically, the number of memory cells that were operating normally at the time point when the first resetting operation was completed is assumed to be 100%. It is clear from FIG. 18 that a rate of decrease of pass cells as test work proceeds is lower in the Near group compared to in the Far group. Moreover, in the Far group, the number of pass cells decreases greatly particularly in the resetting operation.

[Forming Operation]

Figure 19:
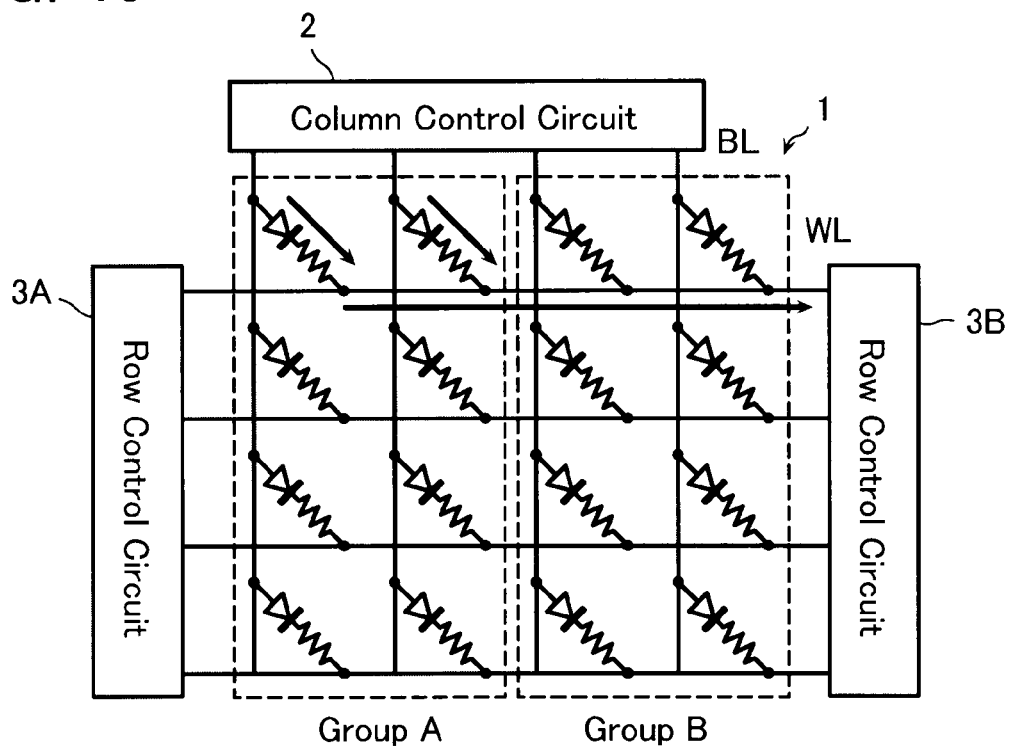
FIG. 19 is a view for explaining a forming operation and a setting operation in the nonvolatile semiconductor memory device according to the first embodiment.

FIG. 19 is a view for explaining the forming operation in the nonvolatile semiconductor memory device according to the present embodiment. In view of the above-described test results, it is considered possible to improve yield during forming by using the control circuit furthest from the memory cells MC when performing the forming operation. Accordingly, in the present embodiment provided with the two row control circuits 3A, 3B, it was decided to define the half of the memory cells MC near to the row control circuit 3A as group A, the half of the memory cells MC near to the row control circuit 3B as group B, and to perform forming using the row control circuit 3B for the memory cells MC of group A and using the row control circuit 3A for the memory cells MC of group B.

Specifically, in the case where the most significant bit MSB of the column address signal inputted to the column control circuit 2 is "0", the memory cells MC of group A are selected, the row control circuit 3B rendered active and the row control circuit 3A rendered inactive, and in the case where the most significant bit MSB of the column address signal inputted to the column control circuit 2 is "1", the memory cells of group B are assumed selected, the row control circuit 3A rendered active and the row control circuit 3B rendered inactive.

Such a method allows the wiring resistance of a portion of the word line WL from the row control circuits 3A or 3B to the memory cells MC to be utilized as a protective element during forming, and hence improve yield of memory cells MC in forming.

[Setting Operation]

When the setting operation in the present embodiment is performed, the row control circuit 3B is employed for the memory cells MC of group A and the row control circuit 3A is employed for the memory cells MC of group B, similarly to the forming operation. In the setting operation, a memory cell MC in the high-resistance state continues to have a constant current passed through it. However, when a memory cell MC is set and has shifted to the low-resistance state, flow of current increases rapidly in the memory cell MC. As a result, load on the memory cell MC increases. However, in the case that the setting operation is performed by the method as described above, the wiring resistance of a portion of the word line WL from the row control circuit 3 to the memory cells MC functions as a serial resistance, whereby the load on the memory cells MC can be reduced. This allows the number of write times of the memory cells MC to be improved.

[Resetting Operation]

Figure 20:
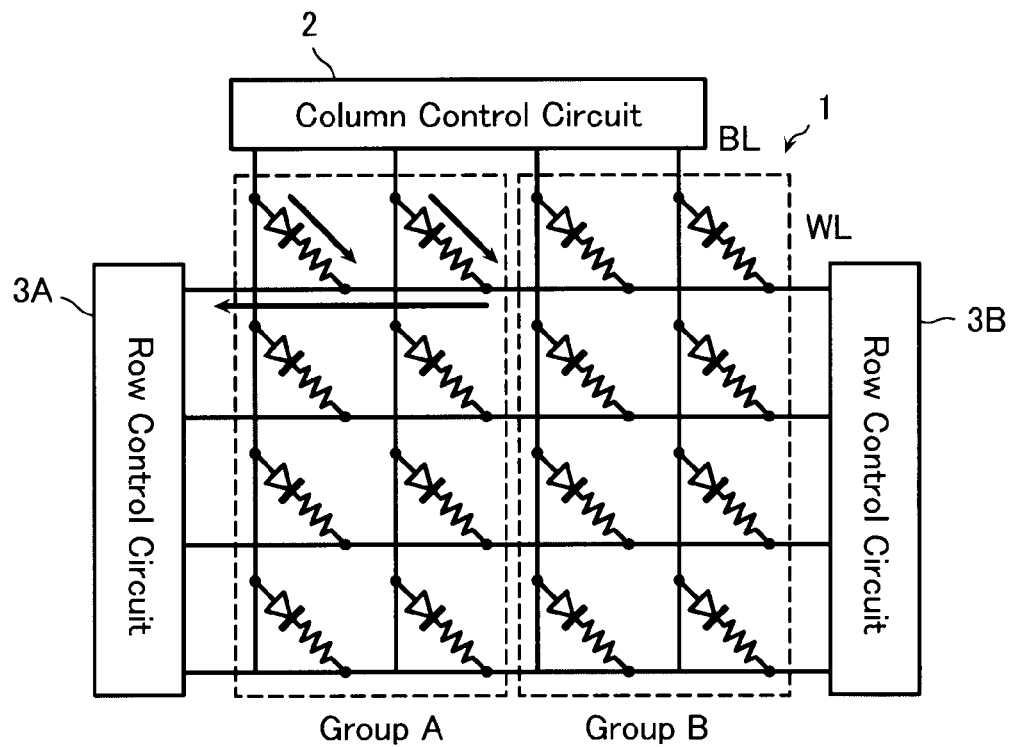
FIG. 20 is a view for explaining a resetting operation in the nonvolatile semiconductor memory device according to the same embodiment.

FIG. 20 is a view for explaining the resetting operation in the nonvolatile semiconductor memory device according to the present embodiment. In view of the above-described test results, the number of possible write times of the memory cells can be improved by using the control circuit nearest to the memory cells MC when performing the resetting operation. This is considered to be because, in the case of the resetting operation, effects due to IR drop are smaller when using the control circuit nearest to the memory cells MC. Accordingly, in the present embodiment, it was decided to perform the resetting operation employing the row control circuit 3A for the memory cells MC of group A and employing the row control circuit 3B for the memory cells MC of group B. From the above-described test results, such a method allows the number of write times of the memory cells MC to be improved.

[Second Embodiment]

Figure 21:
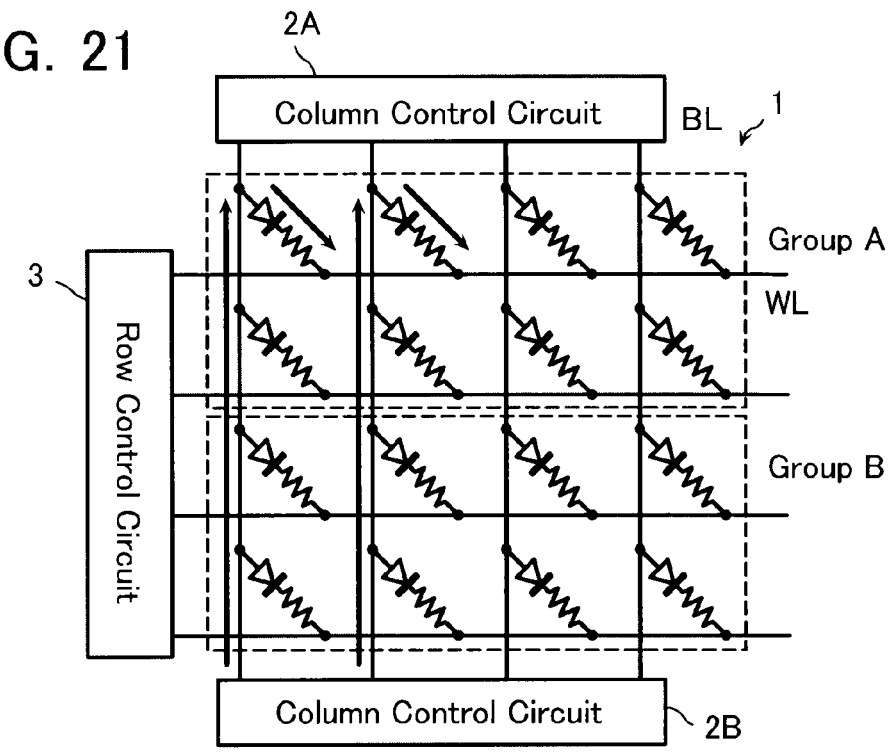
FIG. 21 is a view for explaining a forming operation and a setting operation in a nonvolatile semiconductor memory device according to a second embodiment.
Figure 22:
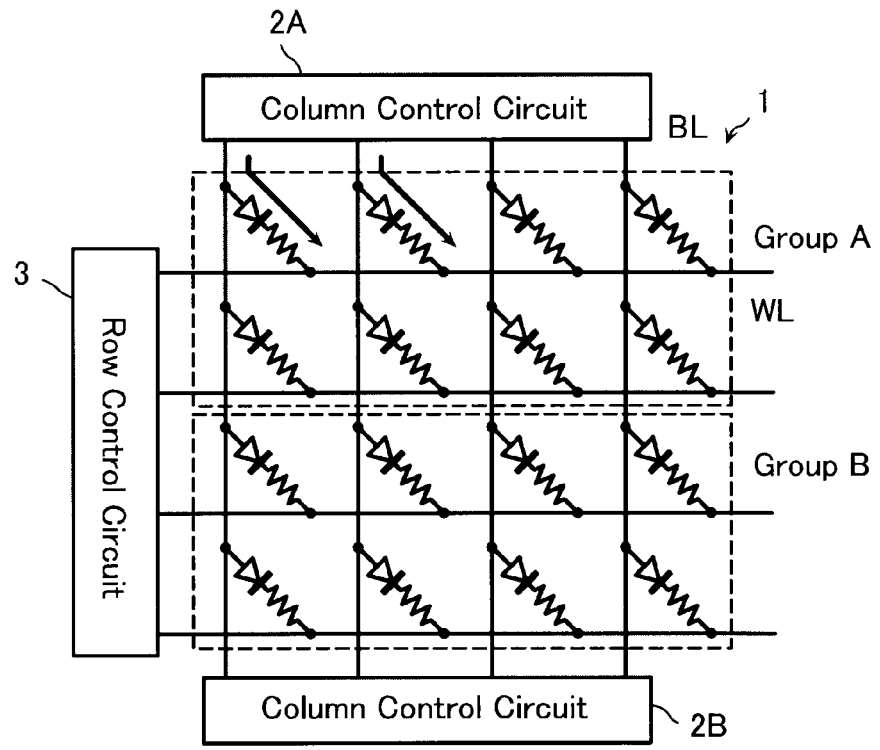
FIG. 22 is a view for explaining a resetting operation in the nonvolatile semiconductor memory device according to the same embodiment.

In the nonvolatile semiconductor memory device according to the first embodiment, two row control circuits 3A, 3B are disposed sandwiching the memory cell array 1. However, there may also be two column control circuits 2 disposed. In a second embodiment, one row control circuit 3 and two column control circuits 2A, 2B are disposed. How the forming operation, setting operation, and resetting operation in this embodiment work are shown respectively in FIGS. 21 and 22. The plurality of word lines WL are divided in two in the bit line BL direction to form group A and group B. The row control circuit 3 selects one of group A and group B. As shown in FIG. 21, the forming operation and setting operation of group A is performed using the column control circuit 2B far from group A, and the forming operation and setting operation of group B is performed using the column control circuit 2A far from group B. In addition, as shown in FIG. 22, the resetting operation of group A is performed using the column control circuit 2A near to group A, and the resetting operation of group B is performed using the column control circuit 2B near to group B. Such a method also enables the number of write times of the memory cells MC to be improved, similarly to the method in the first embodiment.

[Third Embodiment]

In the nonvolatile semiconductor memory device according to the first embodiment and the second embodiment, two row control circuits 3 or column control circuits 2 are disposed sandwiching the memory cell array 1. In a third embodiment, each of row control circuits 3A, 3B, and column control circuits 2A, 2B are disposed. How the forming operation, setting operation, and resetting operation in this embodiment work are shown respectively in FIGS. 23 and 24.

Figure 23:
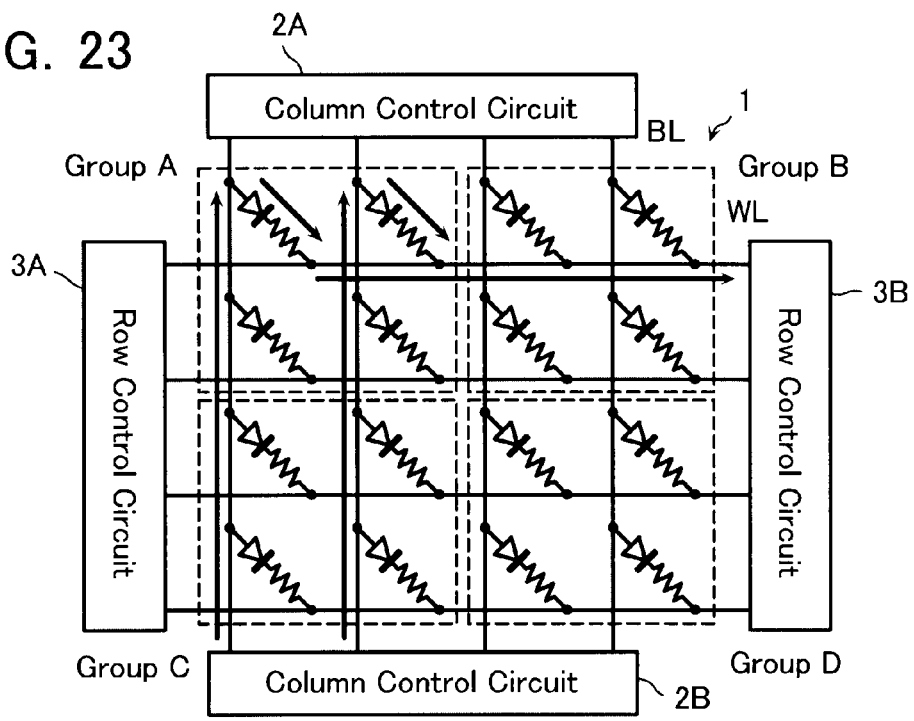
FIG. 23 is a view for explaining a forming operation and a setting operation in a nonvolatile semiconductor memory device according to a third embodiment.
Figure 24:
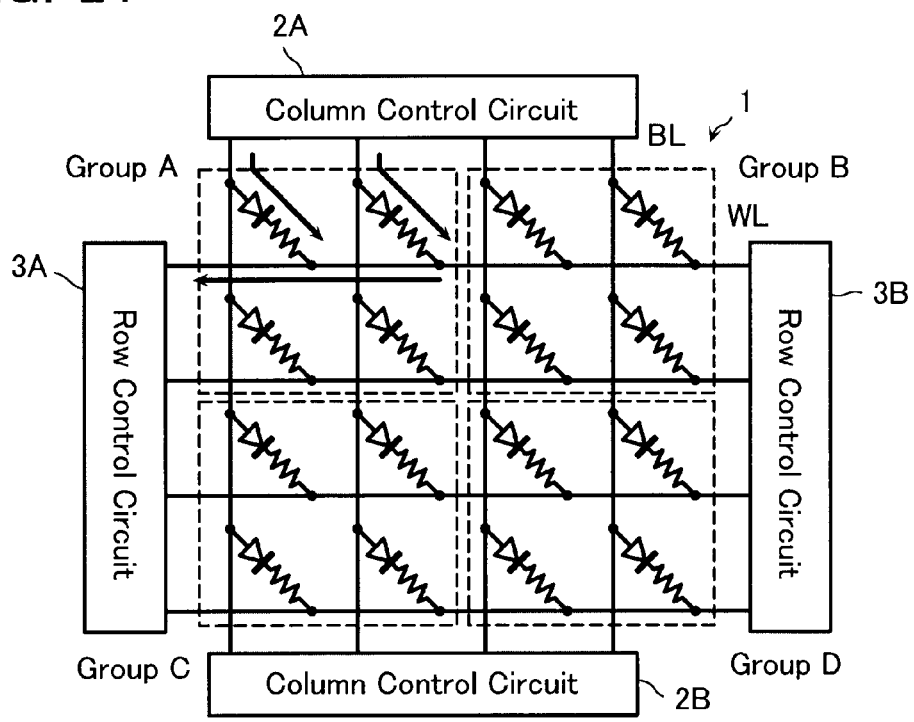
FIG. 24 is a view for explaining a resetting operation in the nonvolatile semiconductor memory device according to the same embodiment.

The plurality of bit lines BL are divided in two in the word line WL direction, and the plurality of word lines WL are divided in two in the bit line BL direction. As a result, the plurality of half parts of bit lines BL and word lines WL are formed into groups A, B, C, and D. The column control circuits 2A, 2B select one from among groups A, C, and groups B, D, and the row control circuits 3A, 3B select one from among groups A, B, and groups C, D. In this embodiment, as well as the forming operation, setting operation, and resetting operation similar to those of previous embodiments being possible, the following, for example, are also possible. That is, as shown in FIG. 23, the forming operation or setting operation of group A by means of the column control circuit 2B and row control circuit 3B and the forming operation or setting operation of group D by means of the column control circuit 2A and row control circuit 3A can be performed simultaneously. In addition, the forming operation or setting operation of group B by means of the column control circuit 2B and row control circuit 3A and the forming operation or setting operation of group C by means of the column control circuit 2A and row control circuit 3B can be performed simultaneously. Furthermore, as shown in FIG. 24, the resetting operation of group A by means of the column control circuit 2A and row control circuit 3A and the resetting operation of group D by means of the column control circuit 2B and row control circuit 3B can be performed simultaneously. In addition, the resetting operation of group B by means of the column control circuit 2A and row control circuit 3B and the resetting operation of group C by means of the column control circuit 2B and row control circuit 3A can be performed simultaneously. Such a method allows wiring resistance to be more effectively adjusted compared to in the first embodiment and the second embodiment, hence allows the number of write times of the memory cells MC to be further improved.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including a plurality of first lines, a plurality of second lines configured to intersect the first lines, and a plurality of memory cells disposed at each of intersections of the first and second lines and each including a variable resistance element configured to store an electrically rewritable resistance value as data in a nonvolatile manner;
   a first decoder connected to at least one ends of the plurality of first lines and configured to select at least one of the first lines;
   at least one pair of second decoders connected to both ends of the plurality of second lines and configured such that one of the pair of second decoders is selected for selecting the second lines according to a distance between the one of the first lines selected by the first decoder and the both ends of the second lines; and
   a voltage application circuit configured to apply a certain voltage between the first line and the second line selected by the first decoder and the second decoder.

2. The nonvolatile semiconductor memory device according to claim 1, wherein
   when a forming operation is performed on at least one of the memory cells, the second decoder furthest from the selected first line selects at least the one of the second lines.

3. The nonvolatile semiconductor memory device according to claim 1, wherein when a setting operation is performed on at least one of the memory cells, the second decoder furthest from the selected first line selects at least the one of the second lines.

4. The nonvolatile semiconductor memory device according to claim 1, wherein
when a resetting operation is performed on at least one of the memory cells, the second decoder nearest to the selected first line selects at least the one of the second lines.

5. The nonvolatile semiconductor memory device according to claim 1, wherein
when a forming operation or setting operation is performed on at least one of the memory cells, the second decoder furthest from the selected first line selects at least the one of the second lines, and
when a resetting operation is performed on at least one of the memory cells, the second decoder nearest to the selected first line selects at least the one of the second lines.

6. The nonvolatile semiconductor memory device according to claim 1, wherein
the first lines are bit lines, the second lines are word lines, the first decoder is a column control circuit, and the second decoder is a row control circuit.

7. The nonvolatile semiconductor memory device according to claim 1, wherein
the first lines are word lines, the second lines are bit lines, the first decoder is a row control circuit, and the second decoder is a column control circuit.

8. A nonvolatile semiconductor memory device, comprising:
a memory cell array including a plurality of first lines, a plurality of second lines configured to intersect the first lines, and a plurality of memory cells disposed at each of intersections of the first and second lines and each including a variable resistance element configured to store an electrically rewritable resistance value as data in a nonvolatile manner;
a first decoder connected to at least one ends of the plurality of first lines and configured to select at least one of the plurality of first lines according to a first address signal;
at least one pair of second decoders connected to both ends of the plurality of second lines and configured such that one of the pair of second decoders is selected for selecting the second lines according to at least a portion of the first address signal and a second address signal; and
a voltage application circuit configured to apply a certain voltage between the first line and the second line selected by the first decoder and the second decoder.

9. The nonvolatile semiconductor memory device according to claim 8, wherein
the plurality of first lines are divided in two in a direction of the second lines to configure first and second groups,
when a most significant bit of the first address signal is a first value, the first decoder selects at least one of the first lines of the first group, and when the most significant bit of the first address signal is a second value, the first decoder selects at least one of the first lines of the second group, and
the pair of second decoders is inputted with the most significant bit of the first address signal and with the second address signal, and, according to a value of the most significant bit of the first address signal, one of the pair of second decoders decodes the second address signal and selects one of the second lines.

10. The nonvolatile semiconductor memory device according to claim 8, wherein
when a forming operation is performed on at least one of the memory cells, the second decoder furthest from the group to which the one of the first lines selected by the first decoder according to the first address signal belongs selects one of the second lines.

11. The nonvolatile semiconductor memory device according to claim 8, wherein
when a setting operation is performed on at least one of the memory cells, the second decoder furthest from the one of the first lines selected by the first decoder according to the first address signal selects one of the second lines according to a most significant bit of the first address signal and the second address signal.

12. The nonvolatile semiconductor memory device according to claim 8, wherein
when a resetting operation is performed on at least one of the memory cells, the second decoder nearest to the one of the first lines selected by the first decoder according to the first address signal selects one of the second lines according to the first address signal.

13. The nonvolatile semiconductor memory device according to claim 8, wherein
when a forming operation or setting operation is performed on at least one of the memory cells, the second decoder furthest from the one of the first lines selected by the first decoder according to the first address signal selects one of the second lines according to a most significant bit of the first address signal and to the second address signal, and
when a resetting operation is performed on at least one of the memory cells, the second decoder nearest to the one of the first lines selected by the first decoder according to the first address signal selects one of the second lines according to the most significant bit of the first address signal and the second address signal.

14. A nonvolatile semiconductor memory device, comprising:
a memory cell array including a plurality of first lines, a plurality of second lines configured to intersect the first lines, and a plurality of memory cells disposed at each of intersections of the first and the second lines and each including a variable resistance element configured to store an electrically rewritable resistance value as data in a nonvolatile manner;
a pair of first decoders connected to both ends of the plurality of first lines and configured such that one of the pair of first decoders selects at least one of the first lines;
at least one pair of second decoders connected to both ends of the plurality of second lines and configured such that one of the pair of second decoders is selected for selecting the second lines according to a distance between the one of the first lines selected by the first decoder and the both ends of the second lines; and
a voltage application circuit configured to apply a certain voltage between the first line and the second line selected by the first decoder and the second decoder.

15. The nonvolatile semiconductor memory device according to claim 14, wherein
when a forming operation is performed on at least one of the memory cells, the second decoder furthest from the selected first line selects at least the one of the second lines.

16. The nonvolatile semiconductor memory device according to claim 14, wherein when a setting operation is performed on at least one of the memory cells, the second decoder furthest from the selected first line selects at least the one of the second lines.

17. The nonvolatile semiconductor memory device according to claim 14, wherein
when a resetting operation is performed on at least one of the memory cells, the second decoder nearest to the selected first line selects at least the one of the second lines.

18. The nonvolatile semiconductor memory device according to claim 14, wherein
when a forming operation or setting operation is performed on at least one of the memory cells, the second decoder furthest from the selected first line selects at least the one of the second lines, and
when a resetting operation is performed on at least one of the memory cells, the second decoder nearest to the selected first line selects at least the one of the second lines.

19. The nonvolatile semiconductor memory device according to claim 14, wherein
the first lines are bit lines, the second lines are word lines, the first decoder is a column control circuit, and the second decoder is a row control circuit.

20. The nonvolatile semiconductor memory device according to claim 14, wherein
the first lines are word lines, the second lines are bit lines, the first decoder is a row control circuit, and the second decoder is a column control circuit.

* * * * *